United States Patent [19]

Mackenzie

[11] Patent Number: 5,661,403
[45] Date of Patent: Aug. 26, 1997

[54] APPARATUS AND METHOD FOR TESTING A SOLID ELECTROLYTE

[76] Inventor: Franklin F. Mackenzie, 8021 E. Carol Way, Scottsdale, Ariz. 85260

[21] Appl. No.: 492,665

[22] Filed: Jun. 20, 1995

Related U.S. Application Data

[63] Continuation-in-part of Ser. No. 212,162, Mar. 14, 1994, abandoned.

[51] Int. Cl.$^6$ .......................... G01N 27/28; G01N 27/07
[52] U.S. Cl. .......................... 324/450; 324/724; 204/400; 429/103
[58] Field of Search .................. 324/439, 425, 324/450, 713, 724, 715, 444; 73/153; 204/400; 429/103, 104

[56] References Cited

U.S. PATENT DOCUMENTS

| | | | |
|---|---|---|---|
| 2,685,023 | 7/1954 | Root | 204/400 |
| 2,913,386 | 11/1959 | Clark | 324/439 |
| 2,985,830 | 5/1961 | Coulton | 324/439 |
| 3,366,565 | 1/1968 | Bokshitsky | 324/425 |
| 3,404,035 | 10/1968 | Kummer et al. | 136/6 |
| 3,404,036 | 10/1968 | Kummer et al. | 136/6 |
| 3,488,271 | 1/1970 | Kummer et al. | 204/180 |
| 3,535,163 | 10/1970 | Dzieciuch et al. | 429/104 |
| 3,591,481 | 7/1971 | Riseman | 324/425 |
| 3,672,994 | 6/1972 | Mitoff | 429/104 |
| 4,097,345 | 6/1978 | Shannon | 429/104 |
| 4,216,273 | 8/1980 | Cadart et al. | 429/104 |
| 4,374,701 | 2/1983 | Singh | 156/667 |
| 4,381,968 | 5/1983 | Singh | 156/663 |
| 4,514,629 | 4/1985 | Smith et al. | 250/311 |
| 4,587,484 | 5/1986 | Shulman | 324/754 |
| 4,609,596 | 9/1986 | Hitchcock et al. | 429/104 |
| 4,636,732 | 1/1987 | Willis | 324/450 |
| 4,732,824 | 3/1988 | Bindin | 429/104 |
| 4,939,363 | 7/1990 | Bando et al. | 250/306 |
| 5,036,271 | 7/1991 | Mazur et al. | 324/758 |
| 5,051,977 | 9/1991 | Goldberg | 369/126 |
| 5,103,094 | 4/1992 | Hayes et al. | 250/306 |
| 5,187,367 | 2/1993 | Miyazaki et al. | 250/306 |
| 5,313,062 | 5/1994 | Yamada | 250/310 |
| 5,477,155 | 12/1995 | Proulx et al. | 324/439 |
| 5,536,593 | 7/1996 | Redey et al. | 429/103 |

FOREIGN PATENT DOCUMENTS

| | | | |
|---|---|---|---|
| 63-269052 | 11/1988 | Japan | 204/400 |

OTHER PUBLICATIONS

Sudworth & Tilley, "The Sodium Sulfur Battery", Apr. 1985, pp. 232–240.

Brieter & Dunn, "Time Dependency of Asymmetric Resistance of Polycrystalline B"-Alumina", Apr. 1985, Electrochimica Acta, vol. 26, No. 9, pp. 1247–1251.

Stemmer, Hefti, Aebi & Engel, "Scanning Tunneling & Transmission Electron Microscopy", Dec. 1989, Ultramicroscopy 30, pp. 263–280.

*Primary Examiner*—Kenneth A. Wieder
*Assistant Examiner*—Glenn W. Brown
*Attorney, Agent, or Firm*—Charles E. Cates; Richard E. Oney

[57] ABSTRACT

An apparatus and method for measuring conduction current through a sample portion of the surface of the solid conductor that is in contact with a liquid conductor, such as the solid electrolyte of a liquid-solid-liquid battery, is provided. The apparatus includes a probe having a hollow insulating probe body with an interior adapted for holding a small amount of the liquid conductor. The probe body insulates the probe liquid conductor from the surrounding liquid conductor and includes a tip having an opening in communication with the probe interior. The tip is adapted for making sealed contact with the solid conductor surface. The conduction current through the sample area can thereby be isolated and measured. The method for measuring conduction current through the sample area includes providing the probe, positioning the probe tip in sealed contact with the solid conductor, disposing a probe liquid conductor within the probe interior, conducting a current through the probe liquid conductor and the sample area and measuring the probe current.

22 Claims, 3 Drawing Sheets

APPARATUS AND METHOD FOR TESTING A SOLID ELECTROLYTE

CROSS-REFERENCE TO RELATED APPLICATION

This is a continuation-in-part application of a application Ser. No. 08/212,162, filed on Mar. 14, 1994 now abandoned.

BACKGROUND

My invention relates to the inspection and testing of solid conductors. More specifically, it relates to a device and method for measuring conduction current through a sample portion of the surface of a solid conductor that is in contact with a liquid conductor, such as the solid electrolyte of a liquid-solid-liquid battery.

Storage batteries having solid electrolytes are well known. The cells of such batteries have a liquid anode, a solid electrolyte, and a liquid cathode. Typical anodes for these batteries are composed of liquid sodium or lithium or potassium. Typical cathodes are molten sulfur mixed with sulphur salts. Typical electrolytes are solid ceramics, made by high temperature sintering of a mix of stable chemical compounds. The most commonly preferred electrolytes are special forms of alumina, i.e., aluminum oxide crystals, doped heavily with an oxide of the conduction ion. These electrolytes conduct ionic current but act as insulators to electron flow.

To date, one potentially promising solid electrolyte battery has been the sodium-sulfur battery. This battery has an anode of molten sodium and a cathode of molten sulfur in solution with sodium sulfide. The most common electrolyte for such a battery is a sodium-beta"-alumina electrolyte. To maintain the anode and the cathode in a liquid phase, the sodium-sulfur battery typically operates at between 315 degrees C. and 350 degrees C.

A significant advantage of the alumina-electrolyte battery in general, and the sodium-sulfur battery in particular, is its specific energy capacity, i.e., its electrical storage capacity per pound. The sodium-sulfur battery, for example, theoretically could have a specific energy capacity that is eleven times that of the lead-acid battery. In actual practice, the specific energy capacity of such batteries has been reportedly measured at about 7.4 times that of the lead-acid battery. Despite this impressive advantage and extensive research in the field, a great deal of difficulty has been encountered in developing a battery having a reliable solid electrolyte. The solid electrolyte develops cracks, and no battery designer has been able to make a battery with a commercially acceptable life. These cracks generally start on the sodium (anode) side of the battery. Sodium dendrites fill the cracks and ultimately reach the sulfur (cathode) side of the battery, internally short circuiting the battery which results in failure. Although various theories have been advanced as to the cause of the cracking in the electrolyte, the exact cause of the cracking remains unknown.

Typically, examination of failed electrolyte samples is performed using a scanning electron microscope or an atomic force microscope. Each of these devices can be used to map the topography of the surface of the sample in order to detect cracks. However, these devices suffer from a number of testing drawbacks. Because flaws consisting of potentially destructive metal dendrite growth locations are characterized by high conductivity, a device capable of mapping the conductivity of the electrolyte in detecting and examining the cause of electrolyte failure is useful. However, neither the scanning electron microscope nor the atomic force microscope measure data that can be used to map the conductivity of the electrolyte. Likewise, neither of these devices can measure impedance characteristics of the electrolyte, which would be useful in failure analysis.

In addition, both the scanning electron microscope and the atomic force microscope require removing the solid electrolyte from the cell in order to inspect its surface. Consequently, the devices cannot be used to observe surface anomalies as they develop over time or to observe such anomalies while the battery is subjected to an operational electrical load or charging current.

Moreover, the atomic force microscope cannot provide data regarding anomalies that are below the surface of the electrolyte. Although the scanning electron microscope can provide some data regarding subsurface anomalies, electron microscope examination of the electrolyte is a destructive examination. To conduct such an examination, the electrode sample must first be prepared by depositing a conductor on its surface so that the electrons from the beam can be dissipated to prevent charge build-up. This preparation procedure contaminates the sample and renders it unusable as an electrolyte.

For the foregoing reasons, there is a need for an apparatus and method suitable for measuring and mapping the conductivity of the surface of a solid conductor that is in contact with a liquid conductor, such as a solid electrolyte of a liquid-solid-liquid battery. Yet another need for such an apparatus and method is that it be suitable for doing so without contaminating the electrolyte.

A further need for such an apparatus and method is that it be suitable for making such measurements while there is electric conduction across the solid-liquid interface of the conductors, such as when a solid-liquid-solid battery is subjected to an operational electrical load or charging current.

A further need for such an apparatus and method is that it be suitable for measuring and mapping the impedance characteristics of the surface of the solid conductor. An additional need for such an apparatus and method is that it be suitable for providing data regarding anomalies below the surface of the conductor.

SUMMARY

My invention is directed to an apparatus and method for measuring a conduction current through a sample area of a solid conductor surface that is in contact with a bulk liquid conductor, which apparatus and method satisfies the above needs. In such an apparatus, a probe includes a hollow insulating probe body having an interior adapted for holding a probe liquid conductor. The probe body is adapted to insulate the probe liquid conductor from the bulk liquid conductor and has a tip having means defining an opening therein that is in communication with the probe interior. The tip is adapted for making sealed contact with the solid conductor surface. The tip opening defines the sample area of the solid conductor surface when the probe tip is in sealed contact with the solid conductor surface. Thus, the conduction current through the sample area can be isolated and measured when the probe tip is in sealed contact with the solid conductor surface.

In a preferred embodiment, the probe body includes a conducting means disposed partly within the probe interior for contacting the probe liquid and disposed partly at the probe exterior for coupling to an electrical terminal. Also in a preferred embodiment, the probe body comprises a tube. The probe body can comprise an elastic material, and the means for defining the probe tip opening can include an insulating elastic boot. The insulating elastic boot has a contact surface for making sealed contact with the solid conductor surface. In a preferred embodiment, the probe contact surface has a diameter that is at least about four times the diameter of the probe tip opening. In another embodiment, the probe body comprises an L-shaped tubular member. The probe tip can be comprised of ceramic, such as boron nitrate.

An apparatus for measuring a conduction current through a sample area of a solid conductor surface that is in contact with a bulk liquid conductor includes a probe. The probe includes a hollow probe body having an interior adapted for holding a probe liquid conductor, an exterior, and a tip having means defining an opening therein that is in fluid communication with the interior of the probe body. The apparatus also includes means for electrically insulating the probe body interior from the exterior when the interior is holding the probe liquid conductor and the tip is in sealed contact with the surface of the solid conductor. The apparatus further includes means for positioning the probe tip with the interior of the probe in sealed contact with the surface of the solid conductor.

In one embodiment, the apparatus includes means for positioning the probe tip in contact with the solid conductor surface at predetermined coordinates thereon. The means for positioning the probe tip can include a first means for adjusting the position of the tip parallel to a first axis and a second means for adjusting the position of the probe tip parallel to a second axis that is perpendicular to the first axis. The first means for adjusting the position of the probe tip can include a first positioning motor responsive to a first control signal and the second means for adjusting the position of the probe tip can include a second positioning motor responsive to a second control signal.

The apparatus includes a probe current measuring means for measuring conduction current between the probe liquid conductor and the sample area when the tip probe is in sealed contact with the surface of the solid conductor. It can also include a bulk current measuring means for measuring conduction current between the bulk liquid conductor and the solid conductor. The bulk current measuring means can comprise a power source and a first ammeter coupled in series between the first bulk conductor and an opposing surface of the solid conductor, the first ammeter being coupled to a first terminal of the power supply. The probe current measuring means can comprise a second ammeter coupled between the first terminal of the power supply and the probe liquid conductor.

The solid conductor can comprise an electrolyte of an energy storage cell and the bulk liquid conductor can comprise an electrode of the energy storage cell.

A method for measuring a conduction current through a sample area of a solid conductor surface that is in contact with a bulk liquid conductor includes the steps of providing a probe such as that discussed above, positioning the probe tip in sealed contact with the solid conductor, disposing a probe liquid conductor within the probe interior so that a probe conduction path is formed between the probe liquid conductor and the sample area of the solid conductor surface, conducting a probe current between the probe liquid conductor and the sample area of the solid conductor surface and measuring the probe current.

In a preferred embodiment, the step of disposing the probe liquid within the probe interior comprises immersing the probe tip into the bulk liquid conductor.

For measuring conductivity of the surface area, the step of conducting the probe current can comprise conducting a direct current. For measuring impedance characteristics of the surface area, the step of conducting the probe current can comprise conducting an alternating current, which can include using a sweep frequency generator to generate the alternating current. The step of measuring the probe current can include the step of using an electrical impedance spectrometer to characterize the impedance response at the sample area.

BRIEF DESCRIPTION OF THE DRAWINGS

These and other features, objects and advantages of the invention will be more fully understood from the following more detailed description, appended claims, and accompanying drawings, in which:

DESCRIPTION

Figure 1:
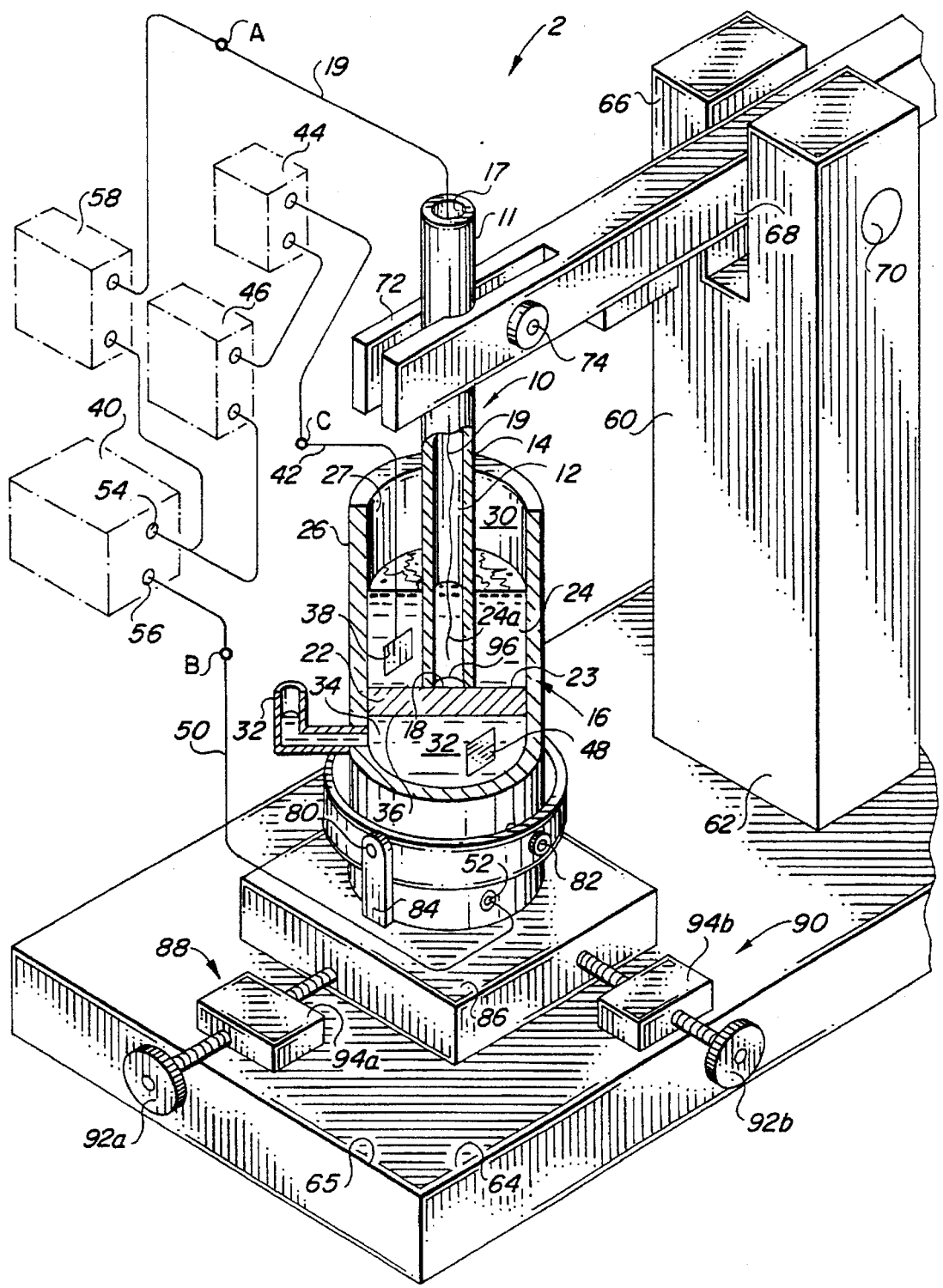
FIG. 1 is a partial sectional perspective view of a tester in accordance with my invention, showing the probe interior, the bulk liquid conductor and the solid conductor, with the probe positioned against the solid conductor for measuring conduction current across the sample area.

In accordance with my invention, FIG. 1 shows a testing device generally designated 2. A probe 10 has an elongated, hollow probe body 11 defining a probe interior 12 and a probe exterior 14. At one end of the probe 10 is a probe tip 16 defining a tip opening 18 that is in communication with the probe interior 12. The probe body 11 is made of an electrically insulating material, and the probe tip 16 is sufficiently elastic to form a seal when it engages a surface 23 of a solid conductor 22. A flexible conducting probe wire 19 is disposed within the probe interior 14 and extends out of the probe body 11 through a second probe opening 17 at the end opposite the probe tip 16.

Figure 2:
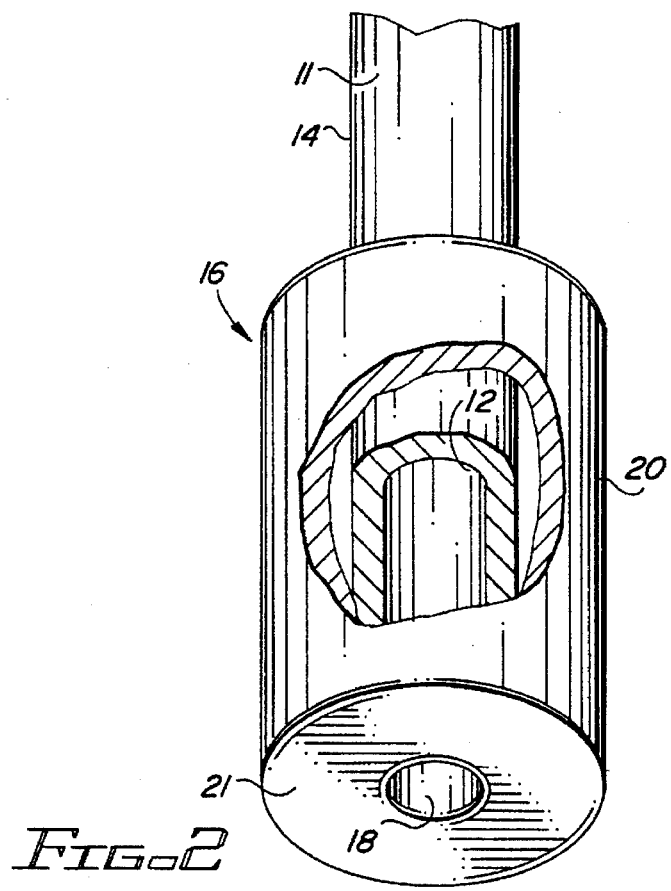
FIG. 2 is an enlarged partial sectional view of a probe tip with an elastic shoe, in accordance with my invention, showing the elastic shoe in detail.

Referring to FIG. 2, the probe tip 16 preferably, but optionally, includes an elastic shoe 20 fitted over the probe body 11 and having a generally circular surface 21 for contacting the solid conductor surface 23. The contact surface 21 defines the tip opening 18. The shoe 20 is sufficiently resilient to create a seal when the contact surface 21 is in contact with the solid conductor surface 23.

An elongated probe arm 68 supports the probe body 11 in a generally vertical orientation. The probe arm 68 is supported in a generally horizonal orientation by an elongated, generally vertical probe support 60 having a base 62 and a slotted top 66. The support base 62 attached to a base plate 64, which has a generally flat top surface 65. The probe support top 66 defines a vertical slot for receiving the probe arm 68. The probe arm 68 has a clamp 72 at one end for releasably holding the probe body 11. The clamp 72 is tightened to clamp the probe body 10 and loosened to release the probe body 10 by a clamping screw 74. The other end of the probe arm 68 is loosely fitted into the slotted top 66 and is coupled to the slotted top 66 by a hinge pin 70, thereby providing a fulcrum point about which the probe arm 68 can rotate. In this configuration, the probe can be moved in a generally vertical direction by lifting the probe arm 68 at an intermediate point along its length.

A cylindrical cup 26 having an opening 27 at its top is used to hold the solid conductor 22 for testing. The cup is made of electrically insulating material. The solid conductor 22 is disk-shaped, having a surface 36 opposing the surface 23, and is sized to closely fit the cross-section of the inside of the cup 26. The conductor 22 is affixed and sealed to the inside of the cup 26 at an intermediate point along the length of the cup 26. In this configuration, the cup is divided into an open first chamber 30 and a second chamber 32. A first bulk liquid conductor 24 is filled to a level within the first chamber 30, thereby contacting the solid conductor surface 23. The second chamber 32 is completely filled with a second bulk liquid conductor 34 by means of a fill tube 33. When the probe body 11 is lowered into the first bulk liquid conductor 24, as shown in FIG. 1, a small portion of the first bulk liquid conductor 24, enters the probe interior 12 and forms a probe liquid conductor 24a. As the probe body 11 is moved vertically in the bulk liquid conductor 24 the amount of liquid in the probe liquid conductor 24a varies.

The bulk liquid conductors 24, 25 are connected to a circuit for measuring bulk conduction current at the interface of the first bulk liquid conductor 24 and the solid conductor surface 23 as follows. A first conductive plate 38 is immersed in the first bulk liquid conductor 24 and is connected by a first flexible wire conductor 42 to a terminal C. A second conductive plate 48 is immersed in the second bulk liquid conductor 34 and is connected by a second flexible wire conductor 50 disposed through a sealed aperture 52 in the cup 26 to a terminal B. A power supply 40 having a first terminal 54 and a second terminal 56 is coupled in series with a rheostat 44 and a first ammeter 46 between terminal B and terminal C. In this configuration, an electrical circuit is completed, which can be used for generating a bulk current at the interface of the solid conductor surface 23 with the bulk liquid conductors 24, 34.

The probe wire 19 is disposed within the interior of the probe body 11 so that it contacts the probe liquid conductor 24a when the probe tip 16 is immersed into the first bulk liquid conductor 24 to contact the solid conductor surface 23. The probe wire 19 is coupled in series, through terminal A, with a second ammeter 58 to the power supply first terminal 54. When the probe tip 16 contacts the solid conductor surface 23, it forms a seal about the probe tip opening 18 at a sample surface area 96 of the solid conductor surface 23. This completes an electrical circuit for conducting and measuring the current conduction across the sample surface area 96 which circuit is isolated from the bulk conduction current circuit.

For positioning the probe tip 16 at a given location on the solid conductor surface 23, the cup 26 is mounted on one side of a gimbal 80 with clamped bearings 82. The other side of the gimbal 80 is mounted by a gimbal mount 84 to a slidable platform 86. The slidable platform 86 rests on the top surface 65 of the base plate 64. A first position shifter 88 is coupled to the slidable platform 86 for moving the slidable platform 86 over the base plate top 65 along the x-axis of the plane defined by the base plate top 65. A second position shifter 90 is mounted to the base plate 64 and is coupled to the slidable platform 86 at a right angle to the first position shifter 88 for moving the slidable platform 86 along the y-axis of the base plate top 65. Each of the position shifters comprises a positioning screw 92a, 92b mated to a threaded block 94a, 94b that is mounted to base plate 64.

The tester 2 is used to measure conduction current through the sample area 96 of the solid conductor surface 23 as follows. During initial set-up of the tester 2 the clamped bearings 82 are loosened and the gimbal 84 is adjusted to ensure that the probe tip 16 makes a good seal with the conductor surface 23 when the probe 10 is lowered to make contact with the conductor surface 23. This minimizes current leakage from the bulk liquid conductor 24 to the probe liquid conductor 24a during measurement of conduction currents and improves the accuracy of those measurements. As the probe tip 16 is lowered to contact the sample area 96, an insulating seal is formed by the probe tip 16, thereby isolating the probe liquid conductor 24a from the bulk liquid conductor 24.

The rheostat 44 is used to adjust the bulk current to ensure that the electrical potential at the tip of the probe is approximately equal to the average potential over the solid conductor surface 23. Normally, then, the ratio of the tip current to the bulk current is the same as the ratio of the effective tip area to the whole area of the bulk solid-liquid interface. From this baseline current the variations of tip currents at successive locations is used to detect and measure anomalies in the solid electrolyte conductor.

Figure 3:
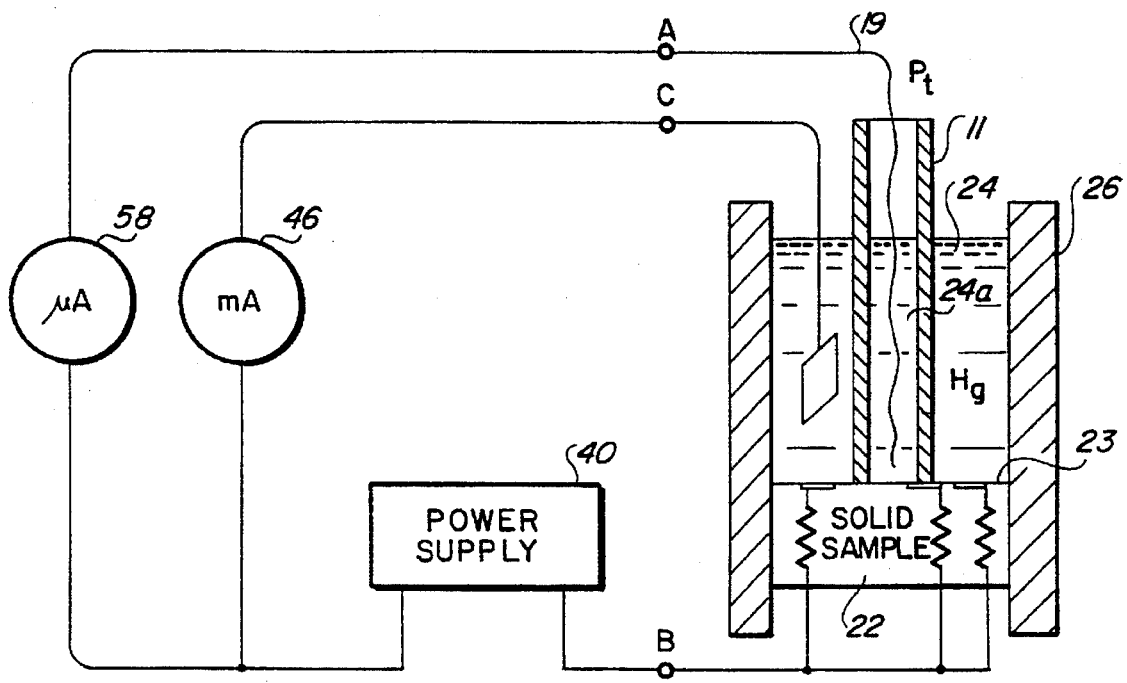
FIG. 3 is a side view of a portion of tester in accordance with my invention showing a cross-section of the probe, the solid conductor and the bulk liquid conductor and a schematic representation showing the solid conductor, the power supply and the other circuit elements for generating and measuring the conduction current through the surface of the solid conductor.

Referring to FIG. 3, an experimental prototype of a tester similar to the tester shown in FIG. 1 has been made for operation at room temperature using mercury as the first bulk liquid conductor 24. The solid conductor 22 was fashioned by bunching a number of carbon resisters together, encasing them in epoxy, and sanding one side of the bunch to form a relatively flat solid conductor surface 23. At the other side of the bunched resistor solid conductor 22, the resistor leads were connected together to form the terminal B. The solid conductor 22 was then sealed into a one inch PVC pipe coupler with bath tub silicone to form the cup 26 and the first chamber 30 for holding the mercury bulk liquid conductor 24. A microammeter was used for the first ammeter 46 and a milliammeter was used for the second ammeter 58. Thumbscrews having 24 threads per inch were used as the positioning screws 92a, 92b. Probe body 10 was made of a pyrex pipette having an inside diameter of 0.9 mm at the probe tip 16. A small platinum wire was used for the probe wire 19. The probe body 11 was fitted with a shoe 20 at the probe tip 16. The shoe 20 was made by shrinking heat-shrink tubing over the probe tip leaving a slight overlap of heat-shrink tubing. When shrunk, the heat shrink shoe 20 defined a tip opening 18 of about 0.9 mm in diameter. The best results were obtained by "fire polishing" the sharp edges of the pyrex pipette tube at the tip end and using a double layer of heat-shrink tubing for the shoe 20. In this configuration, the shoe defined a tip opening 18 of 0.7 mm in diameter and had an overall diameter of 2.4 mm.

This prototype tester was used to measure regions of conduction and non-conduction over the surface of the solid conductor sample 22. By taking data measurements at 0.53 mm apart (i.e., one full turn of the thumbscrews), a 26×26 matrix of conduction data was generated. In a similar manner, a 52×52 matrix of conduction data was measured by turning each of the screws one half turn per sample reading.

Figure 4:
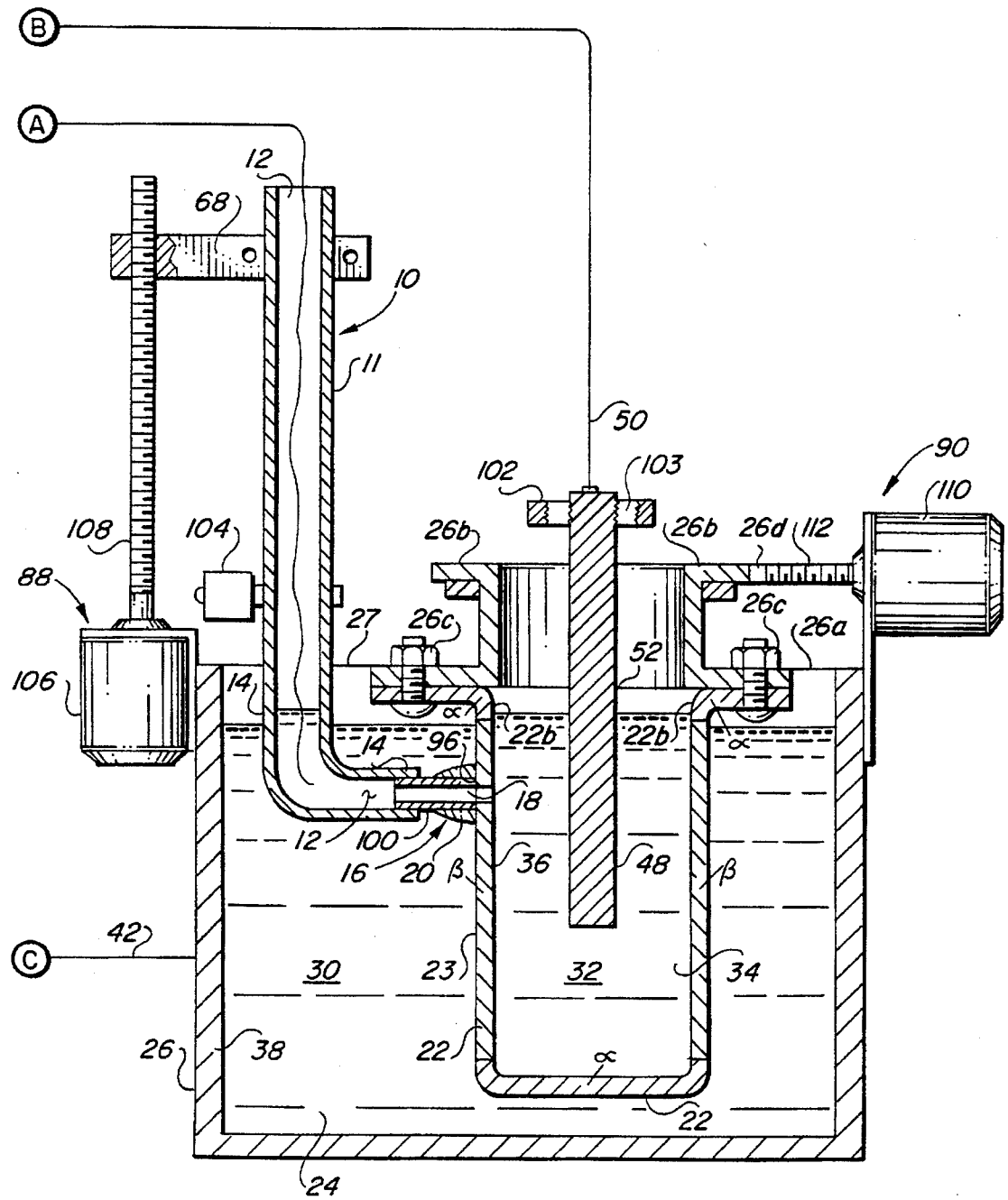
FIG. 4 is a partial cross-sectional side view of a tester in accordance with my invention that is suitable for testing of a tube-shaped ceramic electrolyte such as that typically used in a sodium-sulfur battery.

FIG. 4 shows a tester having features of my invention that is suitable for production testing of electrolyte samples fabricated as tubes of sodium-beta"-alumina. The tester operates in an inert atmosphere such as nitrogen or argon.

The probe body 11 has an L-shaped tube member. The probe tip 16 includes a tube section 100 bonded to the tube body 11 and having an elastic insulating shoe 20 fitted thereon. Preferably, the probe tube section 100 comprises a ceramic material, such as a hollow boron nitrate fiber, which can be made by depositing boron nitrate on a metallic core at high temperature and electrolytically etching out the metallic core. The shoe 20 is comprised of a material which resists attack by sodium at temperatures at or below 350 degrees C. and which is sufficiently resilient to ensure a good seal when pressed against tube 23. Such a shoe can be formed by chemical deposition of such material on the probe tip section 100. A probe tip having an opening 18 as small as about five microns could be manufactured in this manner.

The cup 26 comprises a metal can and the cup opening 27 comprises an opening in the top of the metal can. A support bearing 102 is mounted to the metal can 26 for supporting a solid conductor sample to be tested. Typically, the solid conductor to be tested 22 will be a sintered sodium-beta"-alumina electrolyte manufactured as a tube having a cap 22a of alpha-alumina enclosing one end and a flange 22b of alpha-alumina around the open other end. Such electrolyte tubes are currently being produced for prototype battery cells. The electrolyte tube 22 is mounted to a mounting fixture 26b by a plurality of mounting bolts 26c mated through holes in the flange 22b and the fixture 26b. The fixture 26b and the electrolyte tube 22 are supported from the top of the can 26 by the support bearing 102. A circular gear 26d is mounted around the periphery of the fixture 26b.

The sodium-beta"-aluminum region of the electrolyte tube 22 is immersed into the bulk liquid conductor 24, which comprises molten sodium to form the anode of sodium-sulfur cell. The inside of the electrolyte tube 22 is filled with the second bulk liquid conductor 34, to about the same level as the anodic bulk liquid conductor 24. The second bulk liquid conductor 34 comprises a solution of molten sulfur and sodium sulfide in sufficient parts to form the cathode of a sodium-sulfur battery. The wall of cup 26 serves as the first conductive plate 38, which is attached to terminal C by the first flexible wire conductor 42. A rod-shaped second conductive plate 48 is mounted to the inside the top of the can 26 with an insulated bushing 103 so that the second conductive plate 48 is immersed into the cathodic bulk liquid conductor 34. The second flexible wire conductor 50 connects the rod 48 to terminal B.

A solenoid 104 is coupled to probe body 11 for moving the solenoid tip 16 towards and away from the electrolyte surface 23 in response to a solenoid control signal. The first position shifter 88 comprises a first positioning motor 106 coupled to the probe arm 11 by a worm gear 108 for lowering and raising the probe arm 68. The second position shifter 90 comprises a second positioning motor 110 that is coupled to and drives the circular gear 26d by a second worm gear 112. In this configuration, the second positioning motor 110 can rotate the electrolyte tube 22 about its longitudinal axis in response to a control signal.

The tester of FIG. 4 can be used to measure the ionic conduction of a small area on the electrolyte surface while the entire electrolyte is conducting sodium ions at full battery load conditions. To measure the conduction current across the sample area 96 on the electrolyte 22, the probe tip 16 is pulled away from the tube surface 23 by the solenoid 104 in response to an appropriate solenoid control signal. Appropriate control signals are then applied to the first positioning motor 106 and the second positioning motor 110 to position the test area 96 adjacent to the probe tip 16. A control signal is then applied to the solenoid 104 to push the probe tip 16 against the sample area 96 for a measurement. Measurements of the sample area conduction current and the bulk conduction current can then be taken in a manner similar to that described above.

After measuring the conduction current at the sample area 96, the solenoid can again be activated to pull the probe tip 16 away from the electrolyte surface 23, and control signals can then be applied to the first and second positioning motors 106, 110 to position the probe tip 16 adjacent a different sample area. The measurement sequence described above can then be repeated. In this manner, conduction current measurements can be taken across over the entire surface of the sodium-beta"-alumina region of the electrolyte 22. All of the measurements can be compared to the overall conduction between the first bulk liquid conductor and the solid conductor. This data can be used to calculate conductivity of the entire solid conductor surface 23.

The above described apparatus and method possesses several advantages. Among these, the apparatus and method can be used for measuring and mapping the conduction current at the surface of a solid conductor that interfaces with a liquid conductor. Moreover, these measurements can be made while there is electric conduction across the solid-liquid interface of the conductors. In addition, the device and method can be used to measure and map impedance characteristics of the surface of the solid conductor. Such conduction and impedance measurements can provide data for evaluating both surface and subsurface anomalies in the solid conductor. The apparatus and method is particularly useful for testing solid electrolytes such as those used in liquid-solid-liquid batteries while the electrolyte is under an operational electrical load or charging current. Such testing can be conducted without contaminating the electrolyte.

Although my invention has been described in considerable detail with reference to certain preferred embodiments, it will be apparent to those of ordinary skill in the art that various modifications and adaptations to those embodiments are possible. For example, means for positioning the probe tip may positioning devices such as those used to position the head of an atomic force microscope, including stepping motors for coarse position adjustment and piezo-electric crystal devices for fine position adjustment. As another example, the power supply 40 may be a sweep frequency generator used with an electrical impedance spectrometer to separately characterize the impedance response at each sample area of the solid conductor surface. Therefore, the spirit and scope of the appended claims should not necessarily be limited to the exact construction and operation shown and described, and accordingly, all suitable modifications and equivalents may be resorted to, falling within the scope of the invention.

I claim:

1. In an apparatus for measuring a conduction current through a sample area of a solid conductor surface that is in contact with a bulk liquid conductor, a probe comprising:

a hollow insulating probe body having an interior adapted for holding a probe liquid conductor, an exterior and being adapted to insulate the probe liquid conductor from the bulk liquid conductor;

the probe body having a tip having means defining an opening therein in communication with the probe interior and adapted for making sealed contact with the solid conductor surface; and the opening defining the sample area of the solid conductor surface when the probe tip is in sealed contact with the solid conductor surface;

whereby the conduction current through the sample area can be isolated and measured when the probe tip is in sealed contact with the solid conductor surface.

2. The probe of claim 1 wherein the probe body comprises a tube.

3. The probe of claim 1 wherein the probe body further comprises conducting means disposed partly within the probe interior for contacting the probe liquid and disposed partly at the probe exterior for coupling to an electrical terminal.

4. The probe of claim 1 wherein the body comprises an elastic material.

5. The probe of claim 1 wherein the means for defining the probe tip opening comprises an insulating elastic boot.

6. The probe of claim 5 wherein the insulating elastic boot has a contact surface for making sealed contact with the solid conductor surface, the contact surface having a diameter that is at least about four times the diameter of the probe tip opening.

7. The probe of claim 1 wherein the probe body comprises an L-shaped tubular member.

8. The probe of claim 1 wherein the probe tip comprises ceramic.

9. The probe of claim 8 wherein the probe tip comprises boron nitrate.

10. An apparatus for measuring a conduction current through a sample area of a solid conductor surface that is in contact with a bulk liquid conductor, the apparatus comprising:

a probe comprising a hollow probe body having an interior adapted for holding a probe liquid conductor and a tip having means defining an opening therein that is in fluid communication with the interior of the probe body;

means for electrically insulating the probe body interior from the bulk liquid conductor when the interior is holding the probe liquid conductor and the tip is in sealed contact with the surface of the solid conductor; and means for positioning the probe tip with the interior of the probe in sealed contact with the surface of the solid conductor.

11. The apparatus of claim 10 further comprising means for positioning the probe tip in contact with the solid conductor surface at predetermined coordinates thereon.

12. The apparatus of claim 10 wherein the means for positioning the probe tip includes a first means for adjusting the position of the tip parallel to a first axis and a second means for adjusting the position of the probe tip parallel to a second axis that is perpendicular to the first axis.

13. The apparatus of claim 12 wherein the first means for adjusting the position of the probe tip includes a first positioning motor responsive to a first control signal and the second means for adjusting the position of the probe tip includes a second positioning motor responsive to a second control signal.

14. The apparatus of claim 10 further comprising a probe current measuring means for measuring conduction current between the probe liquid conductor and the sample area when the tip probe is in sealed contact with the surface of the solid conductor.

15. The apparatus of claim 14 further comprising a bulk current measuring means for measuring conduction current between the bulk liquid conductor and the solid conductor.

16. The apparatus of claim 15 wherein:

the bulk current measuring means comprises a power source and a first ammeter coupled in series between the first bulk conductor and an opposing surface of the solid conductor, the first ammeter being coupled to a first terminal of the power supply; and the probe current measuring means comprises a second ammeter coupled between the first terminal of the power supply and probe liquid conductor.

17. The apparatus of claim 10 wherein the solid conductor comprises an electrolyte of an energy storage cell and the bulk liquid conductor comprises an electrode of the energy storage cell.

18. A method for measuring a conduction current through a sample area of a solid conductor surface that is in contact with a bulk liquid conductor, the method comprising:

providing a probe having a hollow insulating probe body having an interior adapted for holding a probe liquid conductor and adapted to insulate the probe liquid conductor from the bulk liquid conductor, and a tip adapted for making sealed contact with the solid conductor surface and having means defining an opening therein in communication with the probe interior, the opening defining the sample area of the solid conductor when the probe tip is in sealed contact with the solid conductor surface;

positioning the probe tip in sealed contact with the solid conductor;

disposing a probe liquid conductor within the probe interior so that an probe conduction path is formed between the probe liquid conductor and the sample area of the solid conductor surface;

conducting a probe current between the probe liquid conductor and the sample area of the solid conductor surface; and measuring the probe current.

19. The method of claim 18 wherein the step of conducting the probe current comprises conducting a direct current.

20. The method of claim 18 wherein the step of conducting the probe current comprises conducting an alternating current.

21. The method of claim 20 wherein the step of conducting the alternating probe current comprises using a sweep frequency generator to generate the alternating current and the step of measuring the probe current comprises the step of using an electrical impedance spectrometer to characterize the impedance response at the sample area.

22. The method of claim 18 wherein the step of disposing the probe liquid within the probe interior comprises immersing the probe tip into the bulk liquid conductor.

* * * * *